United States Patent [19]
Le et al.

[11] Patent Number: 5,648,726
[45] Date of Patent: Jul. 15, 1997

[54] REMOTELY ACCESSIBLE ELECTRICAL FAULT DETECTION

[75] Inventors: Anh V. Le, Pembroke, Mass.; Jeffrey S. Kilber, Hazen, N. Dak.

[73] Assignee: Pacific Scientific Company, Weymouth, Mass.

[21] Appl. No.: 425,879

[22] Filed: Apr. 21, 1995

[51] Int. Cl.⁶ .................................................. H01H 31/02
[52] U.S. Cl. ........................................ 324/555; 340/870.02
[58] Field of Search ............................ 324/72, 72.5, 457, 324/555, 556, 557, 558, 559, 500, 508, 509, 512, 522, 525, 534, 537, 538; 340/870.01, 870.02, 531, 657

[56] References Cited

U.S. PATENT DOCUMENTS

| | | | |
|---|---|---|---|
| 4,546,309 | 10/1985 | Kang et al. | 324/555 |
| 4,600,923 | 7/1986 | Hicks et al. | 340/870.02 |
| 5,153,837 | 10/1992 | Shaffer et al. | 324/103 R |
| 5,519,388 | 5/1996 | Adair, Jr. | 340/870.62 |
| 5,583,492 | 12/1996 | Nakanishi et al. | 340/870.02 |

OTHER PUBLICATIONS

"Bird–On–A–Wire Description", 2 pages (Greenetree Engineering Inc., St. Petersburg, Florida—Jan., 1993).

"Bird–On–A–Wire Specification Sheet", 2 pages (Greenetree Engineering Inc., St. Petersburg, Florida—Jan., 1993).

"Instructions for Bird–On–A–Wire Radio Set", pp. 1–4 (Greenetree Engineering Inc., St. Petersburg, Florida—Jan., 1993).

"FIXCELLNET" Communications description sheet, p. 9 (Jan. 1993).

Technical Data entitled "Eagle Power Line Monitoring System", 2 pages (1995).

*Primary Examiner*—Sandra L. O'Shea
*Assistant Examiner*—Roger Phillips
*Attorney, Agent, or Firm*—Lahive & Cockfield, LLP

[57] ABSTRACT

The invention relates to a remotely accessible electrical fault detection system. According to one preferred embodiment, the system includes a weather-resistant housing having a mount adapted for mating to an aperture in an outer wall of a utility cabinet containing an electrical network; a circuit adapted for connection to the electrical network, wherein the circuit includes at least one of a transmitter and a receiver; and an antenna located inside the weather-resistant housing and coupled to the circuit. In operation, the transmitter can broadcast a radio frequency fault signal to a remote communication device, in response to the electrical network detecting a fault condition.

27 Claims, 7 Drawing Sheets

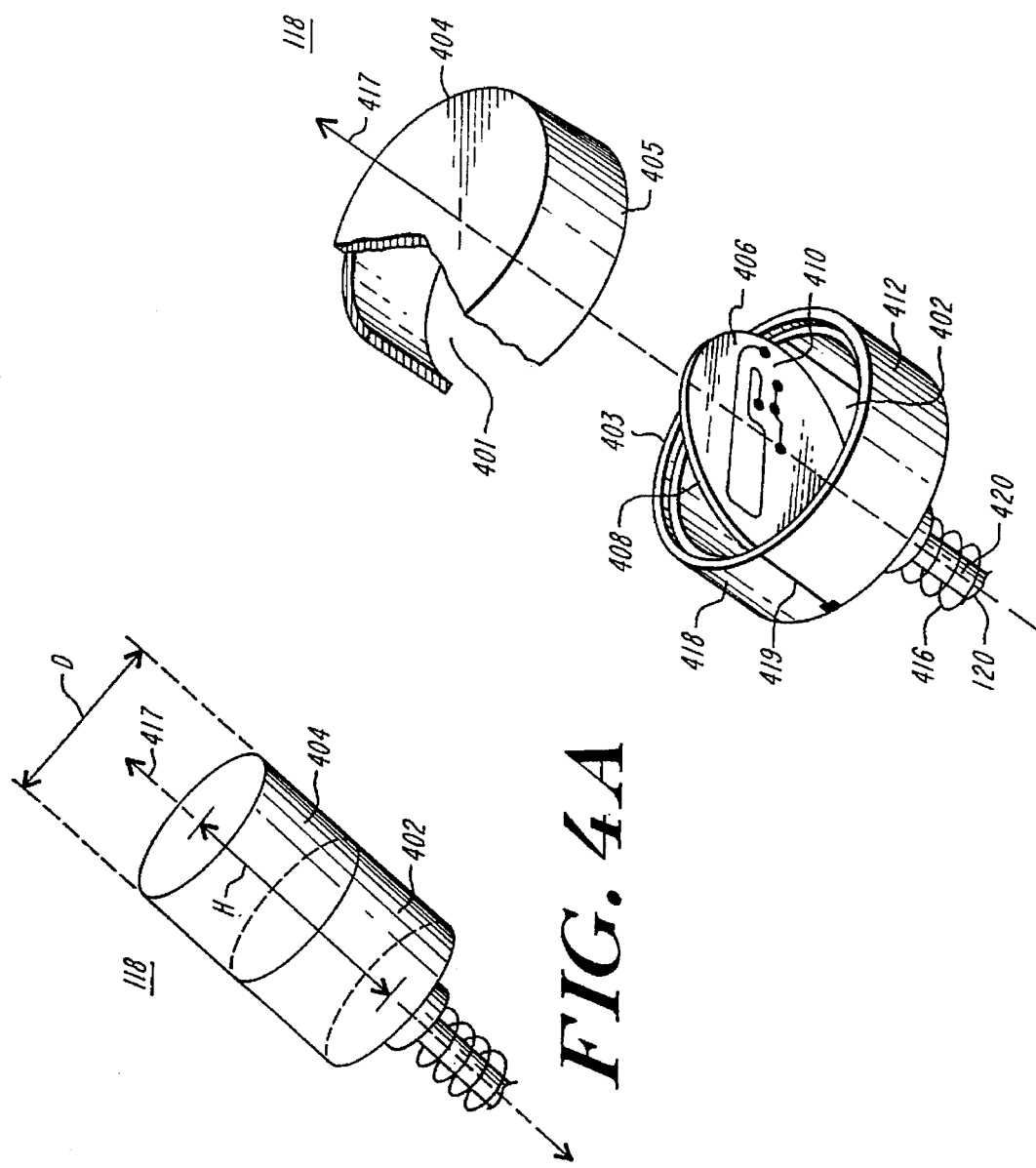

REMOTELY ACCESSIBLE ELECTRICAL FAULT DETECTION

BACKGROUND OF THE INVENTION

The invention generally relates to electrical fault detection. More particularly, the invention relates to apparatus and methods for providing remote access to electrical fault detection measurements.

Conventionally, power cables have been suspended from poles in rural areas, and located in subterranean closets in urban areas. More recently, power cables have also been located underground in rural areas. Locating power cables underground provides many advantages, not the least of which is the elimination of unsightly cabling and poles. In rural areas, subterranean power cables periodically breach the surface at junction points, typically contained in utility cabinets. In urban environments, access to junction points at underground closets is generally provided by way of technician entry locations, commonly referred to as "manholes." Like the underground closets, the utility cabinets provide a relatively weather-resistant, tamper-proof environment for the junction point and related circuitry. Technicians require access to the junction points to perform periodic maintenance, along with various diagnostic tests. Additionally, like the underground closets, the utility cabinets can house test networks that detect various types of electrical faults occurring along a cable. One such test network can, for example, be a ground fault detection network.

A power company often needs to locate an electrical fault that exists somewhere along a relatively long expanse of power cable. According to some prior systems, to determine the particular location of an electrical fault, technicians must manually open utility cabinets or enter subterranean closets by way of manholes along the expanse, and examine the electrical fault detection networks to determine if a fault exists. This procedure can be extremely time consuming under the best of conditions, and can be hazardous during inclement weather. By way of example, both manhole covers and utility cabinets can become frozen shut. Additionally, technicians can slip and fall while entering or exiting icy manholes. Also, urban traffic conditions require police assistance to ensure no automotive accidents occur while a technician is working in a subterranean closet.

Accordingly, an object of the present invention is to provide an improved system for detecting the location of electrical faults occurring along a power cable.

Another object of the invention is to provide remote access to electrical fault detection networks located in subterranean closets and in power utility cabinets.

A further object of the invention is to maintain the relatively tamper-proof, weather-resistant nature of underground closets and power utility cabinets, while providing access to electrical fault detection networks located within the closets and utility cabinets.

Other general and specific objects of the invention will in part be obvious and will in part appear hereinafter.

SUMMARY OF THE INVENTION

The invention relates to apparatus and methods for the remote detection of electrical faults. The invention can be practiced as a system for remotely detecting electrical faults occurring along an electrical power cable. In one such embodiment, the system includes a utility cabinet, a weather-resistant housing, and a communication circuit having an antenna. The utility cabinet has an external wall with an aperture and encloses at least one network for performing an electrical fault detection measurement. The utility cabinet can, for example, be the same cabinet used to house an above-ground junction point along an otherwise subterranean cable. The weather-resistant housing has a mount adapted for mounting to the aperture in the external wall of the utility cabinet. The communication circuit includes either a transmitter or a receiver or both, and it connects to the fault detection network and mounts inside the weather-resistant housing.

According to an alternate embodiment, the invention resides in the weather-resistant housing, which includes a mount adapted for mounting in an aperture that can, for example, be on a bracket or on an external wall of a utility cabinet. The housing contains a communication circuit and disposes the antenna of the circuit with a selected orientation for reliable communication with a remote transmitter or receiver.

The weather-resistant housing can be formed with two mating portions, a base portion and a cover portion. A printed circuit board, having the communication circuit and the antenna fabricated on it, can mount to one portion. The system can include a support fitting for orienting the circuit board, and thus the antenna, to maximize broadcast and/or reception range.

According to operation in one embodiment, an electrical fault detection network signals the communication circuit when it detects an electrical fault in a monitored cable. In one practiced embodiment, the fault is detected by monitoring current in the cable. In an alternative practice, the temperature of the cable is monitored to provide an early indication of a potentially developing fault. In response to a fault detection signal, the communication circuit broadcasts a radio frequency fault signal. A mobile communication device having circuitry for receiving the broadcasted fault signal can alert a technician to the existence of the detected fault. In further embodiments of the invention, the remote communication device includes a keyboard to enable a technician to interrogate the fault detection network to determine for example, the severity of a detected electrical fault.

A method according to the invention includes the steps of providing at least one network for performing an electrical fault detection in a utility cabinet having an external wall with an aperture; mounting a weather-resistant housing to the aperture of the external wall; electrically connecting a communication circuit, having at least one of a transmitter and a receiver, to the network and mounting the circuit inside the weather-resistant housing; and orienting the antenna to the communication circuit for communication over a maximal range from the cabinet.

The invention is further described herein in connection with certain illustrated embodiments. However, it should be clear to those skilled in the art that various modifications, additions and subtractions can be made without departing from the spirit of the invention or the scope of the claims.

BRIEF DESCRIPTION OF THE DRAWINGS

For a fuller understanding of the nature and objects of the invention, reference is to be made to the following detailed description and the accompanying drawings, in which:

FIG. 4A is a perspective view of a transceiver in accord with the invention;

FIGS. 4B and 4C are perspective views of a partially disassembled transceiver unit in accord with the invention;

FIG. 4C is a cross-sectional view of a partially assembled transceiver unit of FIG. 4B in accord with the invention;

DESCRIPTION OF ILLUSTRATED EMBODIMENTS

The invention provides apparatus and methods for the remote access to electrical fault detection networks. According to one embodiment, the invention provides remote access to electrical fault detection networks contained in electrical utility cabinets. As discussed above, such utility cabinets can operate as surface junction points for underground power cables.

Figure 1:
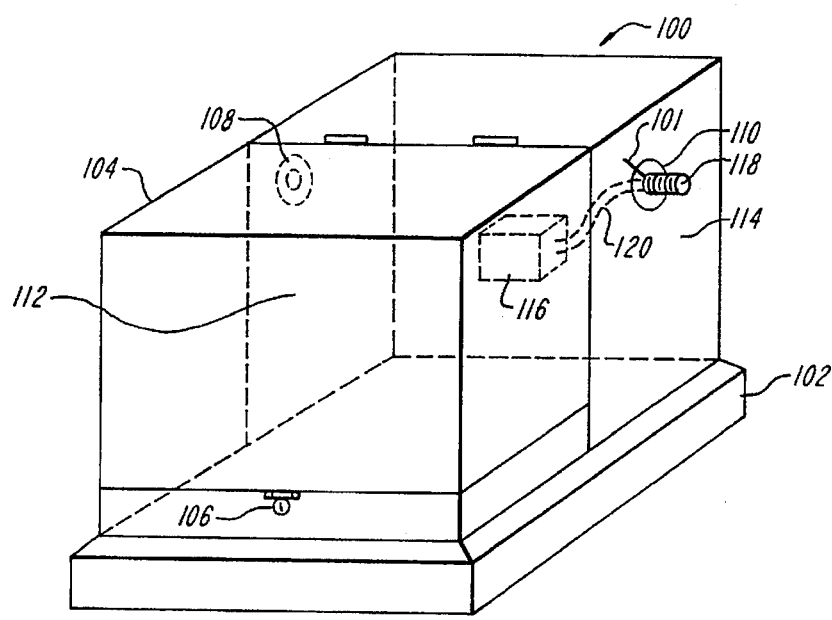
FIG. 1 is a perspective view of a power utility cabinet of the type with which a remotely accessible electrical fault detection network according to the invention can be employed.

FIG. 1 shows a perspective view of a power utility cabinet 100 of the type with which a remotely accessible electrical fault detection network according to the invention can be employed. The utility cabinet 100 is mounted on a foundation pad 102, and includes a hinged access panel 104. The access panel 104 has a locking mechanism 106 to ensure that the cabinet 100 is relatively tamper proof. The utility cabinet 100 can include apertures 108 and 110, which typically are recessed into cabinet walls 112 and 114, respectively. The apertures 108 and 110 conventionally are threaded and mount lift rings or like mechanical fittings used to suspend the utility cabinet 100 during installation onto the foundation pad 102. These mechanical fittings typically seal the apertures against the weather. With the access panel 104 closed and with the mechanical fittings installed in apertures 108 and 110, the utility cabinet 100 provides a weather-resistant environment for the junction point.

As discussed above, the utility cabinet can contain an electrical fault detection network 116. Such a network 116 can be configured to detect any number of faults, including but not limited to current surges, excessive voltage, and ground faults. The network can also be configured to detect various parameters, which may be indicative of a potentially developing fault. By way of example, the network can detect an increase in the temperature of a cable to provide advance warning of a developing fault. In typical prior systems, the network 116 includes one or more fault indicator lights. In those prior art systems, to determine whether a fault exists, a technician must open the access panel 104 and visually inspect the visual fault indicators. However, according to one embodiment of the invention, the mechanical fitting is removed from aperture 110 and replaced by a transceiver unit 118, which connects to the electrical fault detection network 116 by way of cable 120. In response to a detected electrical fault, the network 116 signals the transceiver 118 to broadcast a radio frequency signal indicative of the detected fault. The radio signal can be received by a remote communication device operated by a technician. In this way, the present invention provides a system for locating electrical faults, without requiring physical access to the interior of the utility cabinet 100.

Figure 2:
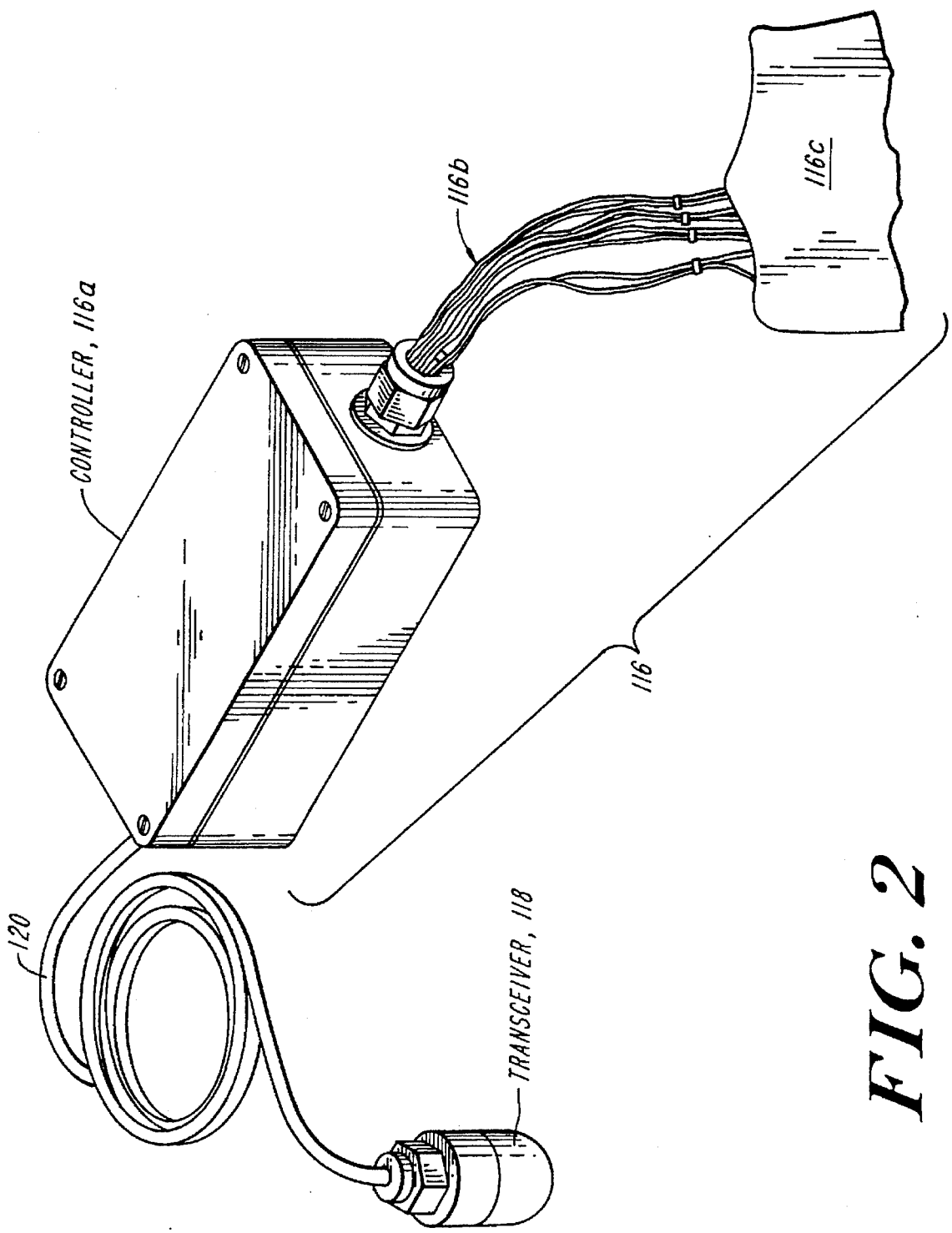
FIG. 2 shows a transceiver and controller for coupling to a remotely accessible electrical fault detection network.

FIG. 2 shows a transceiver 118, along with the electrical fault detection network 116. As shown, the network 116 includes a transceiver controller 116a and a fault detection network 116c. The electrical fault detection network 116c senses faults on any of phases A, B, C or a tap of a three phase power cable, and couples signals representative of whether a fault is sensed to the controller 116a by way of cable 116b. In response to a detected electrical fault, the controller 116a signals the transceiver 118 by way of cable 120 to broadcast a radio frequency fault signal to a remote communication device. According to one embodiment, the controller 116a ascertains the severity of a detected fault from the network 116c, and the transceiver 118 includes such information in its broadcast. According to a further embodiment, the transceiver 118 receives requests for additional information regarding a detected fault from the remote communication device and couples those requests to the controller 116a. In response, the controller 116a ascertains the requested information from the network 116c, and provides the information to the transceiver 118 for broadcast to the remote communication device. In a preferred embodiment, the radio communications between the transceiver 118 and the remote communication device are conducted at 312.0 megahertz and are of a low power that complies with FCC Rules and Regulations to avoid the need for a license from the Federal Communication Commission.

Figure 3:
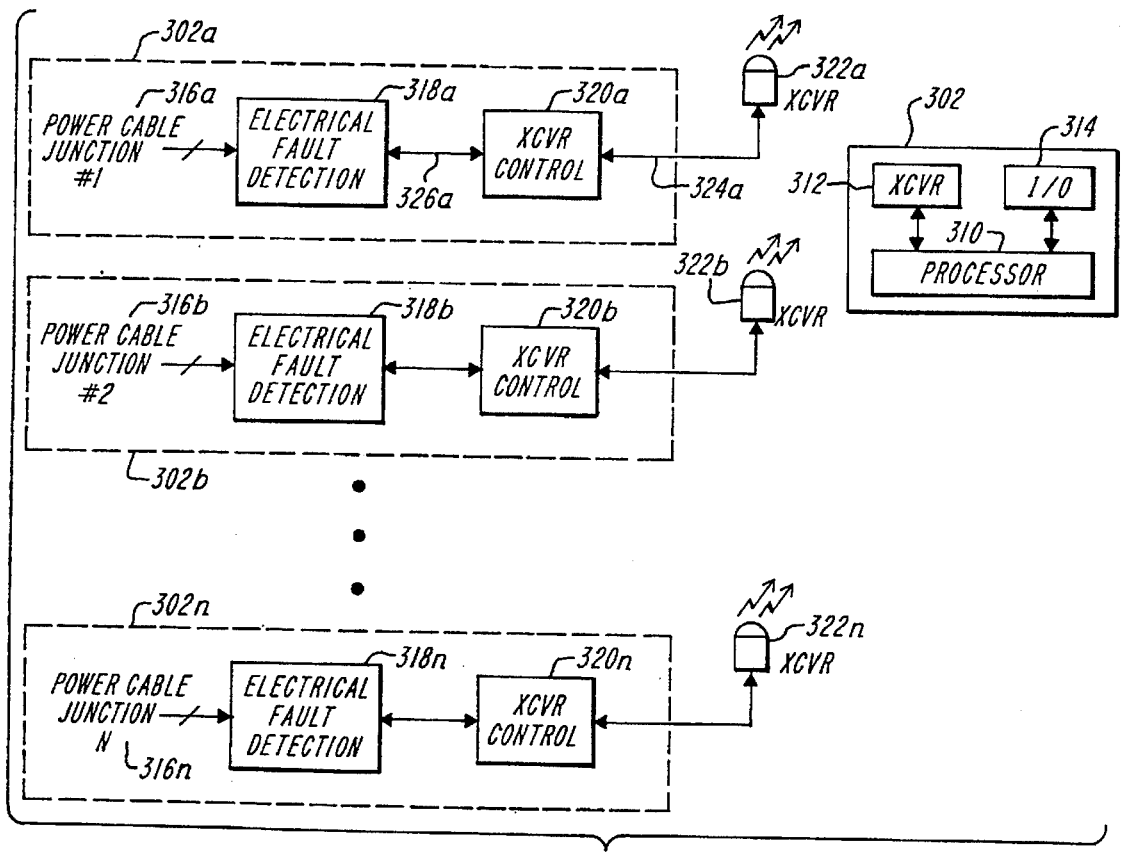
FIG. 3 shows a schematic block diagram of a remote electrical fault detection system in accordance with the invention.

FIG. 3 shows a schematic block diagram for a remote electrical fault detection system 300 in accordance with the invention. The system 300 includes an integer (n) number of utility cabinets 302a–302n, each of the type depicted at 100 in FIG. 1, along with a remote communication device 308. Utility cabinet 302a houses a power cable junction point 316a, an electrical fault detection network 318a, and a transceiver control network 320a. Similarly, utility cabinet 302b includes a junction point 316b, an electrical fault detection network 318b, and a transceiver control network 320b. Utility cabinet 302n has a junction point 316n, an electrical fault detection network 318n, and a transceiver control network 320n. Additionally, each utility cabinet 302a –302n couples to a corresponding transceiver unit 322a –322n, of the type shown at 118 in FIG. 1. The electrical fault detection networks 318a–318n are of the type shown at 116c in FIG. 2, and the transceiver controller networks 320a–320n are of the type shown at 116a in FIG. 2. The remote communication device 308 includes a processor 310, coupled to a transceiver 312 and coupled to an I/O device 314. The I/O device 314 can for example, include a visual display, along with a keypad.

During operation, a technician can travel, with the remote communication device 308, along an expanse of cabling containing utility cabinets 302a–302n. In one instance, the utility cabinets are at intervals along a highway, and the technician monitors each one from within a vehicle travelling on that highway. As the remote communication device 308 passes each utility cabinet, it can detect fault signals broadcast from the associated transceivers 322a–322n. By way of example, if the remote communication device 308 detects a fault signal broadcast from the transceiver 322a, and again from transceiver 322b, but not from the next transceiver 322c, this indicates that a cable fault exists between the locations of the cabinets 302b and 302c. Thus, the invention provides a system that can remotely determine the location of a detected electrical fault along an expanse of cable. According to one embodiment, the utility cabinets 302a–302n are spaced a sufficient distance apart such that the remote communication device 308 is only within range to communicate with one transceiver 322a–322n at any particular time, thus, avoiding interference between signals broadcast from adjacent utility cabinets.

In a further embodiment of the invention also shown in FIG. 3, the technician can interrogate the particular fault detection network that senses an electrical fault by way of the keypad included in the I/O device 314, to gain additional information, such as the severity of the detected fault. During interrogation, the transceiver 312 in the remote communication device transmits an interrogation signal, for example to transceiver 322a. In response, transceiver 322a couples the interrogation signal to the transceiver control network 320a, by way of line 324a. In response, the transceiver control network 320a interrogates the fault detection network 318a for the additional information, by way of line 326a, and provides the additional information back to the remote communication device 308, via the transceiver 322a. According to one practice of the invention, the fault detection network 318a can provide a fault current level which is indicative of the severity of the fault. According to another practice, the fault detection network 318a can provide temperature information to provide advance notice of a potentially developing electrical fault. As those skilled in the art will appreciate, while the transceiver control networks 320a–320n are depicted as separate from their associated fault detection networks 318a–318n, those networks can be combined. Additionally, according to other practices, the remote communication device 308 may not include a keyboard interface and/or a transmitter. Likewise, the transceivers 322a–322n may employ only transmitters, and not include receivers.

With reference to FIGS. 4A through 4C, the illustrated transceiver unit 118 has a two-part housing formed with a base 402 and a cover 404. The base 402, as shown, has a cylindrical wall 418 and is closed at the bottom except for the passage 420 of an axially extending, hollow, threaded stem-like fitting 416. The rimmed edge 403 of the cylindrical wall mountingly seats the housing cover 404, which as shown is preferably hemispherically domed. An adhesive or other fastening can secure the housing cover and the base to form a weather resistant enclosure for the chamber 401 inside the housing. One feature of the invention is that the shell formed from the base 402 and the cover 404 has a relatively low profile when mounted to the outer wall 114 of the utility cabinet 100. By way of example, in a preferred embodiment, the shell formed from the base 402 and the cover 404 has an outer dimension ratio H/D of less than approximately 1.3. In one such embodiment, H is less than approximately 2.3 inches and D is less than approximately 1.9 inches.

The passage 420 within the mounting fitting 416 extends along the axis 417 and communicates with the chamber 401. According to one embodiment, the mounting fitting 416 is threaded. The threaded fitting 416 can be sized to mate with the preexisting aperture 110 of FIG. 1. Alternatively, an additional aperture can be provided in utility cabinet 100 to accommodate threaded fitting 416.

The transceiver housing mounts a printed circuit board 406 within the chamber 401 by way of a support 412 that seats in the base 402. The illustrated support spans a diameter of the housing cylindrical base, and the illustrated circuit board is circular. This geometry of the cylindrical housing base, domed housing cover, diametrical support and circular circuit board are deemed preferable to simplify assembly and alignment, including alignment of the antenna on the circuit board as discussed next.

The illustrated support 412 has a concave mounting portion 413 recessed with a groove 414 for mountingly receiving the circuit board 406. The circuit board 406 carries a transceiver circuit 410 that includes an antenna constructed from electrically conductive strips 408. The transceiver circuit 410 can connect to the controller 416 by way of the cable 422, which passes out of the housing through the passage 420. The circuit board 406 can mount in the groove 414 of the support 412 to have a selected orientation relative to the support and the support in turn can be mounted to the housing base 402 with a selected orientation of the antenna 408 relative to a visual indicator 419 on an outer surface of the cylindrical wall of the base 402. The visual indicator 419 can subsequently be selectively located, i.e. vertically uppermost, or with respect to a visual indicator, as shown at 101 of FIG. 1, on the utility cabinet 100, to orient the antenna 408 to maximize transmission and/or reception range of the transceiver network 410. According to one practice, the circuit board is oriented with the antenna disposed for radiating energy with either horizontal or vertical polarization.

Figure 5:
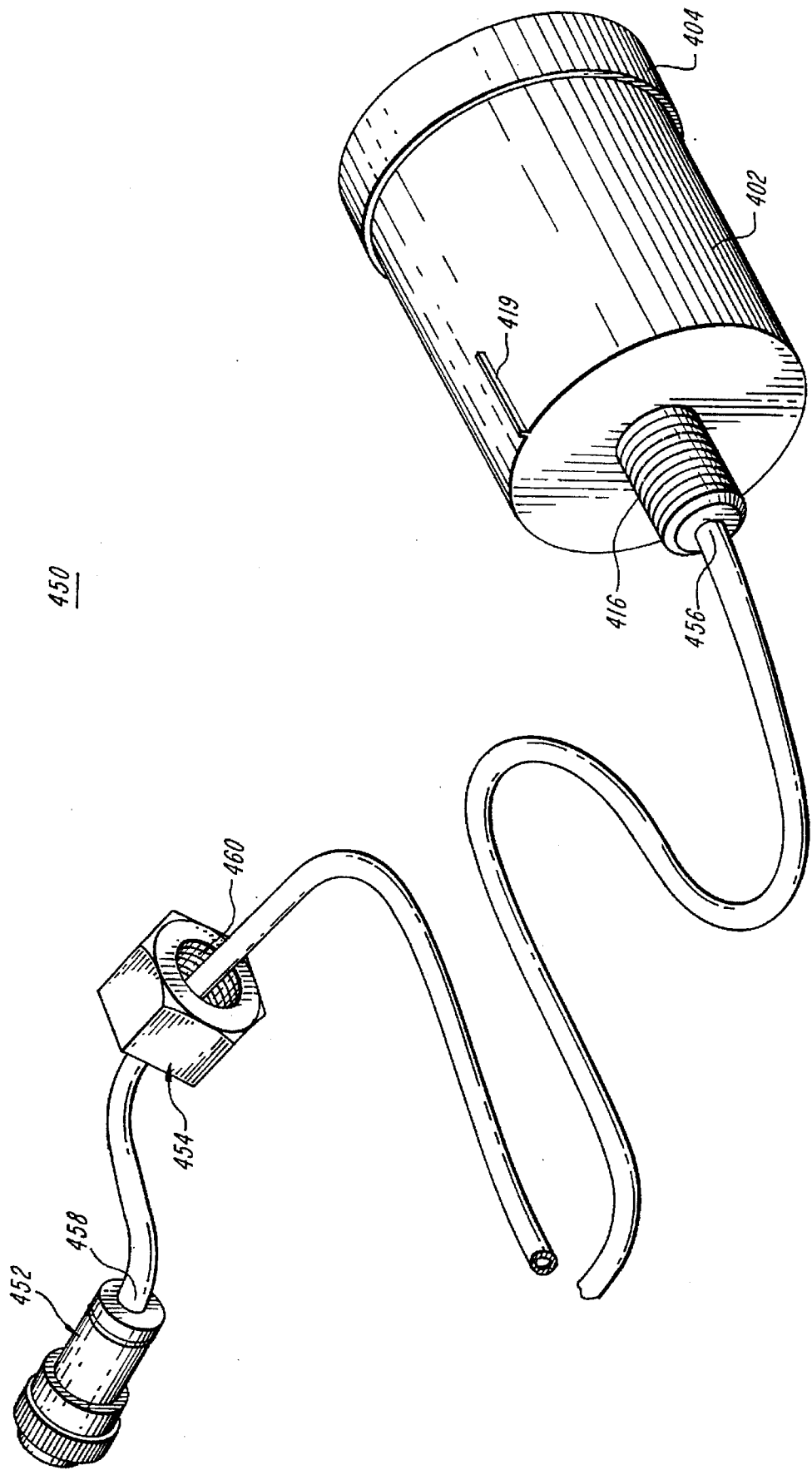
FIG. 5 is a perspective view of an exemplary assemblage for mounting a transceiver according to the invention to a power utility cabinet of the type depicted in FIG. 1.

FIG. 5 shows an illustratively dimensioned perspective view of an exemplary assemblage 450 for mounting the transceiver 118 to the power utility cabinet 100, and for electrically coupling the transceiver 118 to the fault detection network 116. According to the depicted embodiment, the threaded mounting fitting 416 mates to a correspondingly threaded aperture 110 in the utility cabinet 100. The transceiver 118 is installed to have a particular rotational orientation with respect to the visual indicator 419 on the housing base 402 and the visual indicator 101 on the utility cabinet 100. When installed, a portion of the mounting fitting 416 protrudes through aperture 110 into the interior of the utility cabinet 100. Subsequent to being oriented, a threaded locking bolt 454 mates on the interior of the cabinet 100 to the protruding portion of the mounting fitting 416 to fix the rotational orientation of the transceiver 118.

As depicted in FIG. 5 and as also shown in FIG. 4B, a first terminal end 456 of cable 120 couples through the passage 420 to electrically connect to the circuit 410. A second terminal end 458 of the cable 120 has a mating connector 452, which is adapted for mating connection to the controller 116a, shown in FIG. 2, thereby electrically connecting the controller 116a with the transceiver 118. According to one preferred embodiment, the first terminal end 456 of the of the cable 120 is removably coupled through the passage 420. Thus, during installation, the cable 120 can be disconnected from the transceiver 118. Once the transceiver is oriented and locked into place by bolt 454, the first terminal end 456 of the cable 120 can be coupled through the passage 420. In an alternative embodiment, the connector 452 is not connected to the second terminal end 458 of the cable 120 until after the transceiver is installed. Thus, during installation, the terminal end 458 can be passed through the threaded aperture 460 of the locking nut 454 to allow the nut 454 to pass over the cable 120 and to mate with the protruding portion of the mounting fitting 416. In this way, the assemblage 450 provides an exemplary mechanism for installing the transceiver 118 in a utility cabinet 100 of the typed depicted in FIG. 1.

According to a preferred embodiment, the mating connector 452 has a length of 1.42 inches, and a diameter of 0.475 inches. Likewise, the threaded locking bolt 454 has a length of 0.454 inches, a width of 0.853 inches and a depth of 0.75 inches. The illustrated fitting 416, base 402 and cover 404 of the receiver housing also have selected dimensions. For example, the fitting 416 has an axial length of 0.673 inches and a diameter of 0.5 inches. The base 402 has a diameter of 1.76 inches and the cover 404 has a diameter of 1.853 inches. When the base and cover are assembled, the assemblage has an axial length of 2.28 inches.

Figure 6:
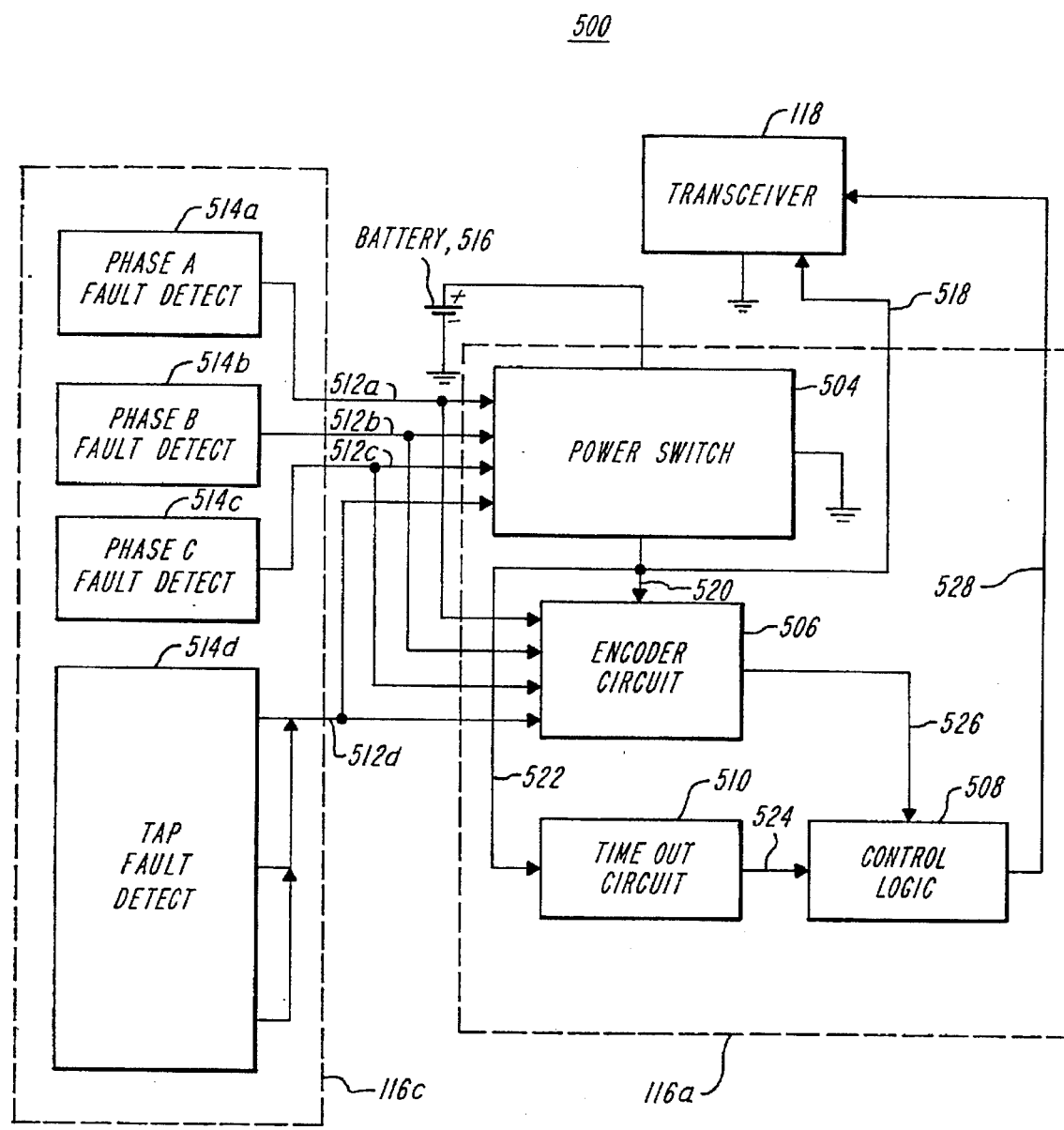
FIG. 6 is a schematic block diagram depicting a remotely accessible electrical fault detection system in accord with the invention.

FIG. 6 shows a schematic block diagram for a transceiver and controller system 500 of the type depicted in FIGS. 2 and 3. The system 500 includes a transceiver 118, a controller 116a, input signals on lines 512a–512d from an electrical fault detection network 116c, and a battery 516. The controller 116a includes a power switch 504, an encoder circuit 506, control logic 508, and a time-out circuit 510. The fault detection network 116c includes circuits 514a–514d for detecting electrical faults on any of phase A, phase B, phase C, and the tap, respectively, of a power cable. The battery 516 powers the power switch 504. In the quiescent state, the system 500 is essentially powered off. In response to a fault signal on any of lines 512a–512d, the power switch 504 applies power to the transceiver 502 over conductor 518; to the encoder 506 over conductor 520; and to the time-out circuit 510 over conductor 522. The time-out circuit 510, in turn, couples power to the control logic 508 by way of conductor 524. The encoder circuit 506 applies a related modulation signal, by way of conductor 526 to the control logic 508 to indicate which detection circuit 514a–514d has sensed an electrical fault. In response to the particular modulation signal received on conductor 526, the control logic 508 signals the transceiver 502 on conductor 528 to broadcast a correspondingly modulated radio frequency signal. The transceiver 502 continues to broadcast this fault-reporting signal until either the fault is removed or the time-out circuit 510 signals the control logic 508 to cease the broadcast. According to the invention, the broadcasted fault-reporting signal can be received by a remote communication device such as that shown at 308 in FIG. 3. As one skilled in the art will appreciate, according to other embodiments, the controller 508 can be a transceiver controller for also controlling reception of messages from the remote communication device 308.

Figure 7:
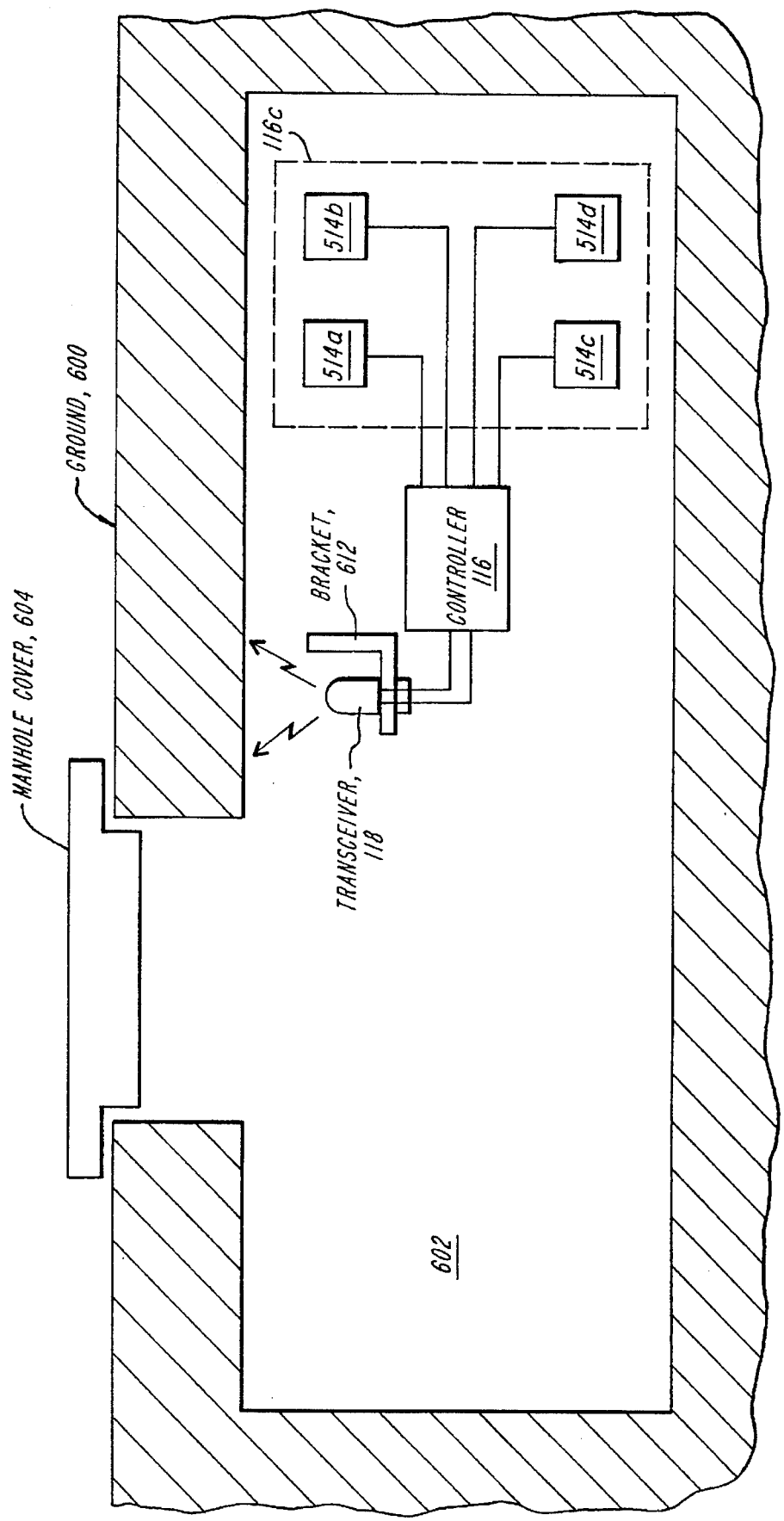
FIG. 7 is a block diagram of an alternate embodiment of the invention employed in a system for remotely accessing an electrical fault detection network located in a subterranean closet.

FIG. 7 shows a schematic block diagram of a remotely accessible electrical fault detection system 600 in accordance with the invention and adapted for operation in an underground closet 602. As previously discussed, a manhole cover 604 provides technicians with access to the closet 602. According to one embodiment of the invention, the transceiver 118 within the underground closet mounts on a supported bracket 612 and couples to electrical fault detection networks 514a–514d by way of the controller 116a. The system 600 can operate in essentially the same manner as the previously described embodiments of FIGS. 1–6, broadcasting radio frequency fault-reporting signals for reception above ground by the remote communication device 308.

Figure 8:
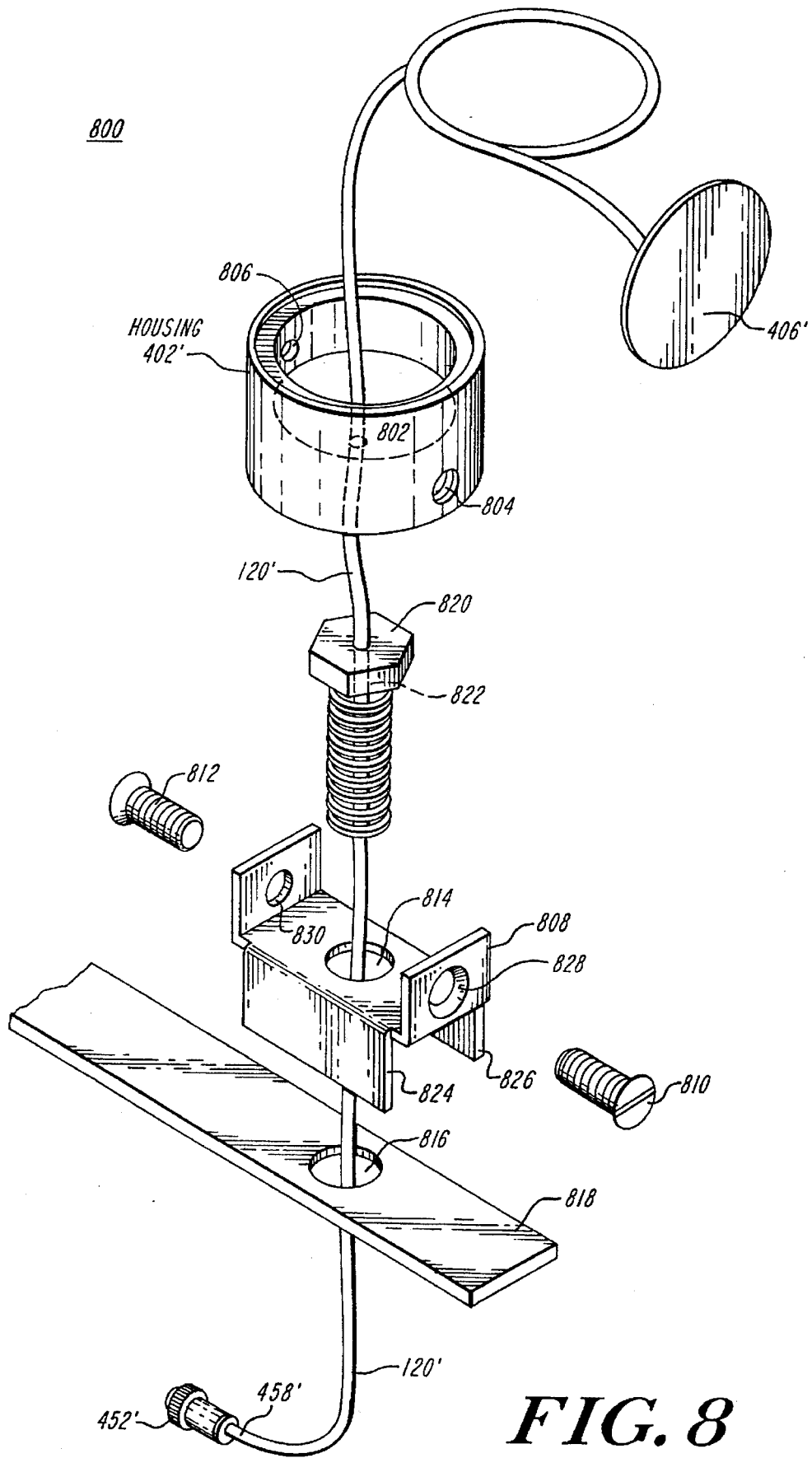
FIG. 8 is a perspective view of a partially disassembled structure for mounting a transceiver according to the invention in a subterranean closet of the type depicted in FIG. 7.

FIG. 8 is a perspective view of a partially disassembled mechanical structure 800 for mounting the transceiver 118 of FIG. 7 in a utility cabinet 602, as depicted in FIG. 7. Elements of the structure 800 that are similar to elements of FIGS. 4 and 5 are identified with the same reference numerals, followed by a superscript prime. As in the case of FIGS. 4 and 5, the cable 120' couples the transceiver circuit board 406' to a connector 452' for subsequent connection to the controller 116a. However, unlike the embodiments of FIGS. 4 and 5, the transceiver housing base 402' does not include a mounting fitting 416. Instead, the housing base 402' includes an aperture 802 through which the cable 120' passes. The housing base 402' has two diametrically opposed threaded apertures 804 and 806 for mounting the housing base 402' to a similarly apertured bracket 808 by way of matingly threaded screws 810 and 812.

The illustrated bracket 808 has a saddle-like configuration with side-by-side webs 824 and 826 extending down from the side of a base, and with opposed end tabs projecting up from the ends of the base. The tabs are apertured with the holes 828 and 830. The bracket 808 includes an aperture 814 through the base and located for axial alignment with a threaded aperture 816 of a fixed support mount 818, located in the subterranean closet 602. A matingly threaded bolt 820 passes through the aperture 814 and mates with threaded aperture 816 to fasten the bracket 808 to the support 818. The threaded bolt 820 has a hollow axial passage 822 through which the cable 120' can pass to connection with connector 452'.

During installation, downward extending support webs 824 and 826 engage the support 818 and the apertures 814 and 816 are aligned. The threaded bolt 820 passes through aperture 814 and mates with threaded aperture 816 to secure the bracket 808 to the support 818. The terminal end 458' of the cable 120' is fed through the passage 822 and thus through the apertures 814 and 816. The housing base 402' can be positioned on bracket 808, bringing apertures 804, 806, 828 and 830 into axial alignment. Once the housing base 402' is positioned, the screw 812 passes through aperture 830 and engages with matingly threaded aperture 806 to secure the housing base 402' to the bracket 808. Similarly, the screw 810 passes through aperture 828 and engages matingly threaded aperture 804. Subsequent to the cable 120' being threaded through the passage 822 and apertures 814 and 816, the connector 452' can be attached to the terminal end 458'. The circuit board 406' can mount in housing base 402' in a similar fashion to that depicted in and described with respect to FIG. 4B. Also, a housing cover, such as that shown at 404 in FIG. 4B can also be provided for the embodiment of FIG. 8.

Thus, the invention efficiently attains the objects set forth above, among those made apparent from the preceding description. As those skilled in the art will appreciate, changes may be made in the above constructions and in the foregoing sequences of operation without departing from the scope of the invention. For example, while the invention has been described in connection with electrical power cable, the invention can also be practiced with virtually any type of remotely located fault detection system. Accordingly, all matter contained in the above description or shown in the accompanying drawing is to be interpreted as illustrative rather than in a limiting sense.

The following claims are intended to cover all generic and specific features of the invention as described herein, and all statements of the scope of the invention which, as a matter of language, might be said to fall therebetween.

Having described the invention, what is claimed as new and secured by Letters Patent is:

1. A remotely accessible outdoor electrical fault detection system for a utility cabinet enclosing at least one network for performing an electrical fault detection measurement, the cabinet having an external wall with an aperture, said system comprising a weather-resistant housing having a mounting fitting adapted for mounting to the aperture of the external wall, a circuit for electrical connection to the fault detection network and mounted inside said weather-resistant housing, said circuit including at least one of a transmitter and a receiver, and an antenna located inside said weather-resistant housing and coupled to said circuit, for communicating between a location outside the cabinet and said circuit.

2. A system according to claim 1 wherein said weather-resistant housing is adapted to be substantially tamper proof.

3. A system according to claim 1 including means for orienting said antenna selectively within said weather-resistant housing to maximize at least one of range to which said antenna can effectively broadcast, and range from which said antenna can effectively receive.

4. A system according to claim 1 wherein said mounting fitting extends along a first axis, and wherein said system includes support means for orienting said antenna for radiating therefrom, outward from said weather-resistant housing, radio frequency energy having a polarization extending longitudinal to said axis.

5. A system according to claim 4 wherein the aperture in the outer wall is located in a first plane and wherein said support means orients said antenna in a second plane substantially perpendicular to said first plane.

6. A system according to claim 1 wherein the existing aperture is threaded and said mounting fitting of said weather-resistant housing is threaded to mate with the aperture.

7. A system according to claim 1 wherein said circuit is formed on a printed circuit board and said antenna is a microstrip antenna formed on said printed circuit board.

8. A system according to claim 1 wherein said circuit is formed on a printed circuit board and said weather-resistant housing comprises a first portion for structurally supporting said printed circuit board and an attachable second portion for coupling to said first portion in a weather-resistant fashion.

9. A system according to claim 7 wherein said weather-resistant housing has a radio transmissive wall.

10. A system according to claim 1 wherein said circuit includes means for receiving an electrical fault detection signal from said network, wherein said electrical fault detection signal is representative of a status of whether said network detects an electrical fault, and means for transmitting a radio signal representative of said status.

11. A system according to claim 1 wherein said circuit includes means for receiving temperature information from said network, wherein said temperature information is representative of an advance status of whether an electrical fault is developing, and means for transmitting a radio signal representative of said status.

12. A system according to claim 10 wherein said circuit includes means for transmitting a radio signal representative of a measurement of severity of a detected electrical fault.

13. A system according to claim 1 further comprising a remote communication device for communicating with said network by way of said antenna and said circuit, and wherein said circuit includes means for receiving an electrical fault detection signal from said network, wherein said electrical fault detection signal is representative of a status of whether said network detects an electrical fault, and means for transmitting a radio signal representative of said status to said remote communication device.

14. A system according to claim 13 wherein said remote communication device includes visual indicator means for alerting a technician to a detected electrical fault.

15. A system according to claim 14 wherein said circuit includes means for transmitting a radio signal to said remote communication device that is representative of a measurement of severity of a detected electrical fault.

16. A system according to claim 13 wherein said circuit includes means for receiving radio signals from said remote communication device.

17. A system according to claim 16 wherein said radio signals received from said mobile communication device are representative of requests for information regarding at least one of, whether said network detects an electrical fault and a measurement of severity of a detected electrical fault.

18. A device for facilitating remote access to an outdoor electrical fault detection network, said device comprising a weather-resistant housing having a mount adapted for mating to an aperture formed in an outer wall of a utility cabinet containing an electrical network, a circuit adapted for connection to an electrical network and mounted inside said weather-resistant housing, wherein said circuit includes at least one of a transmitter and a receiver, and an antenna located inside said weather-resistant housing and coupled to said circuit for communicating between said circuit and the exterior of said housing.

19. A device according to claim 18 further comprising an orientation indicator visible on said housing and having a fixed location relative to a known orientation of said antenna within said housing.

20. A method of performing remotely accessible outdoor electrical fault detection comprising the steps of enclosing at least one network for performing an electrical fault detection measurement in a utility cabinet having an external wall with an aperture, mounting a weather-resistant housing to said aperture of said external wall, electrically connecting a circuit to said network and mounting said circuit inside said weather-resistant housing, said circuit including at least one of a transmitter and a receiver, and coupling an antenna to said circuit and locating said antenna inside said weather-resistant housing, for communicating between said circuit and the exterior of said housing.

21. A method according to claim 20 comprising the further step of selectively orienting said weather-resistant housing relative to said cabinet, for thereby selectively orienting said antenna.

22. A method of converting a non-remotely accessible outdoor electrical fault detection network contained in a utility cabinet into a remotely accessible electrical fault detection network, said method comprising the steps of removing a fixture from a preexisting aperture in an outer wall of said utility cabinet, providing access to said network by way of said preexisting aperture, electrically connecting a circuit to said network by way of said access, wherein said circuit includes at least one of a transmitter and receiver, coupling an antenna to said circuit, mounting said circuit and said antenna in a substantially weather-resistant housing, and mounting said housing to the preexisting aperture.

23. A method according to claim 22 comprising the further step of orienting said antenna to be substantially perpendicular to the outer wall.

24. A method according to claim 23 comprising the further steps of mounting said housing along a first axis extending perpendicularly from the outer wall, and orienting said antenna for radiating therefrom, outward from said housing, radio frequency energy having a polarization axis extending longitudinal to said first axis.

25. Circuit monitoring apparatus for remotely monitoring an operating parameter of an electrical cable, said parameter being detected within a weather resistant outdoor electrical utility cabinet, said apparatus comprising a first mechanical fitting secured at an opening through a wall in the cabinet with a threaded connection through the cabinet wall, a housing having a weatherproof body with a chamber therein and having a threaded mounting fitting secured to the body and extending along a first axis with a passage through the fitting communicating with the chamber, said mounting fitting being adapted for mounting in the opening through the cabinet wall with a threaded connection in place of the first mechanical fitting, a radio antenna mounted within said chamber, and antenna support means for orienting said antenna for radiating therefrom, outward from said body, radio frequency energy having a polarization axis extending longitudinal to said first axis.

26. Circuit monitoring apparatus according to claim 25 wherein said support means includes an electrical circuit board carrying an electrical conductor forming said antenna, and includes means for mounting said circuit board within said chamber oriented longitudinal with said first axis.

27. Circuit monitoring apparatus according to claim 25 wherein said housing is characterized by a maximum outer height H measured along said first axis and a maximum outer diameter D measured transverse to said axis, and wherein the ratio of H/D is less than approximately 1.3.

* * * * *

UNITED STATES PATENT AND TRADEMARK OFFICE
CERTIFICATE OF CORRECTION

PATENT NO. : 5,648,726
DATED : July 15, 1997
INVENTOR(S) : Anh V. Le and Jeffrey S. Kilber It is certified that error appears in the above-identified patent and that said Letters Patent is hereby corrected as shown below:

At column 3, line8, delete "FIGS. 4B and 4C are" and insert--FIGURE 4B is a--

Signed and Sealed this

Twenty-fourth Day of November, 1998

Attest:

BRUCE LEHMAN

Attesting Officer

Commissioner of Patents and Trademarks